(12) United States Patent
Jaramillo et al.

(10) Patent No.: US 6,523,075 B1
(45) Date of Patent: Feb. 18, 2003

(54) METHOD AND SYSTEM FOR CONTROLLING INTERNAL BUSSES TO PREVENT BUSSES CONTENTION DURING INTERNAL SCAN TESTING BY USING A CENTRALIZED CONTROL RESOURCE

(75) Inventors: Ken Jaramillo, Phoenix, AZ (US); Brian Logsdon, Glendale, AZ (US); Franklyn H. Story, Chandler, AZ (US); Subramanian Meiyappan, Tempe, AZ (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/389,871

(22) Filed: Sep. 2, 1999

(51) Int. Cl.$^7$ ............................................... G06F 13/36
(52) U.S. Cl. ....................................................... 710/113
(58) Field of Search ................................ 710/113, 107; 714/724

(56) References Cited

U.S. PATENT DOCUMENTS

| | | | |
|---|---|---|---|
| 4,698,588 A | 10/1987 | Hwang et al. ............ 324/73 R |
| 4,860,290 A | 8/1989 | Daniels et al. ................ 371/25 |
| 5,525,971 A | * 6/1996 | Flynn ..................... 340/825.06 |
| 5,648,733 A | 7/1997 | Worrell et al. ................. 326/86 |
| 6,009,489 A | * 12/1999 | Mergard ..................... 710/107 |

FOREIGN PATENT DOCUMENTS

EP 454052 A2 10/1991 ........... G06F/11/26

OTHER PUBLICATIONS

Patent Abstracts of Japan vol. 017, No. 699 (P–1665), Dec. 21, 1993 & JP 05 240917 A (NEC Corporation), Sep. 21, 1993 abstract.

* cited by examiner

Primary Examiner—Peter Wong
Assistant Examiner—David Glass
(74) Attorney, Agent, or Firm—Peter Zawilski (57) ABSTRACT

A system for preventing bus contention in a multifunction integrated circuit during testing. The system is implemented in an integrated circuit adapted to accept a series of test inputs operable for testing the functionality of the integrated circuit. The integrated circuit includes at least one bus for communicatively coupling the multiple functional blocks. At least a first functional block and a second functional block included in the integrated circuit, the first functional block and the second functional block both coupled to the bus and coupled to accept the test inputs. A bus arbiter is also included in the integrated circuit for granting ownership of the bus. The bus arbiter is operable to disable at least one output of the second functional block if a corresponding output of the first functional block is activated by using a bus grant signal generated for the first functional block. This guarantees that the test inputs can propagate through the first functional block and the second functional block without causing contention for the bus between the first functional block and the second functional block. Alternatively, a centralized test device controller is used to disable the output of the second functional block, as opposed to using the grant signals of the bus arbiter. This allows the incorporation of the implementing logic without altering the logic of the bus arbiter.

16 Claims, 11 Drawing Sheets

METHOD AND SYSTEM FOR CONTROLLING INTERNAL BUSSES TO PREVENT BUSSES CONTENTION DURING INTERNAL SCAN TESTING BY USING A CENTRALIZED CONTROL RESOURCE

This application is related to Applicant's copending application "A METHOD AND SYSTEM FOR CONTROLLING INTERNAL BUSSES TO PREVENT BUS CONTENTION DURING INTERNAL SCAN TESTING" filled on Sep. 2, 1999 and having U.S. patent application Ser. No. 09/389,873.

TECHNICAL FIELD

The present invention pertains to the field design-for-testability of integrated circuit devices. More particularly, the present invention relates to a method and system for preventing bus contention within an integrated circuit device during internal scan testing.

BACKGROUND ART

Computer systems, software applications, and the devices and processes built around them are continually growing in power and complexity. Society's reliance on such systems is likewise increasing, making it critical that the systems obey the properties their designers intended. Typically, the more powerful and complex the system, the greater its utility and usefulness. However, as these computer and software implemented systems and processes become more powerful, detecting and correcting flaws within the systems becomes increasingly difficult.

As integrated circuits, and particularly the logic portion of integrated circuits, have become more complex and more dense, they have become progressively harder to test in order to ensure correct and complete functionality. For example, with current technology, as the total number of transistors fabricated within an integrate circuit die increases, the amount of time which the integrated circuit emerging from a fabrication process line spends in testing increases as well. Hence, the testing cost can be very significant for the latest and largest high density integrated circuits. Very sophisticated test programs, automatic test pattern generation (ATPG) programs, are used to analyze the various netlists representative of the integrated circuit designs and generate therefrom the test patterns (e.g., also referred to as test programs or test vectors) used for testing the devices in automated test equipment (ATE) systems.

The objective of the ATPG program, or tool, is to generate an accurate, high coverage (e.g., testing most of the embodying circuitry of the integrated circuit) test pattern as efficiently as possible, to reduce the cost. Thus, an increasingly important part of the logic synthesis process involves designing ASICs and other complex integrated circuits for inherent testability. This is referred to as designing for testability, or DFT.

One problematic aspect of the DFT process involves high density, multifunction integrated circuits incorporating multiple functional units on one or more internal busses. The use of internal three-state signals or busses with multiple drivers has become commonplace in state-of-the-art system-on-a-chip designs. Also commonplace is the usage of internal scan testing methodologies to test complex designs. Generally, these two aspects of state-of-the-art design have contradictory design and testing impacts to one another.

Current ATPG tools have difficulty interpreting and controlling such structures, but nevertheless require that one and only one driver be actively driving a shared signal at any given time. Multiple active drivers can produce unexpected test results and can potentially damage components during manufacturing test. This problem is made more difficult to solve when the multiple drivers are independently controlled from unique functional blocks that contain autonomous circuitry to activate their respective bus drivers.

One prior art solution for dealing with the problem of multiple functional units contending for one or more internal busses is the implementation of a methodology of forcing the ATPG tool to resolve all bus contention issues. However, this results in lower fault coverage and physically longer times to generate patterns. Additionally, many ATPG programs and tools do not support this solution.

Additionally, the tools that do support bus contention resolution and prevention only do this with limited success. They guarantee that ATPG patterns will not be generated that cause bus contention on any signals or busses, but it is often difficult for the tools to do. The result is often extremely long compile times and very poor fault coverage.

Thus, what is required is a solution that is capable of eliminating any potential bus contention among multiple functional units of an integrated circuit device. What is required is a solution that actively controls multiple bus drivers for the multiple functional units to eliminate bus contention. The required solution should guarantee by design that bus contention cannot occur given any scan test pattern that an ATPG tool might generate, and thus produce test patterns that will result in much higher fault coverage and much faster compile times. The required solution should be easy to implement, uniform in construction and have minimal gate area and system performance impacts on the design.

DISCLOSURE OF THE INVENTION

The present invention is a method and system for eliminating any potential bus contention among multiple functional units of an integrated circuit device. The present invention provides a solution that actively controls multiple bus drivers for the multiple functional units to eliminate bus contention among the functional units as they are stimulated by a series of test inputs (e.g., ATPG test patterns, vectors, etc.). The method and system of the present invention guarantees by design that bus contention cannot occur given any scan test pattern that an ATPG tool might generate, thus allowing the ATPG tool to produce test patterns that will result in much higher fault coverage. Additionally, since the ATPG tool would not have to ensure bus contention could not occur, test patterns can be generated with much faster compile times. The system of the present invention is easily implemented, uniform in construction, and has minimal gate area and system performance impacts on the overall design of integrated circuit devices.

In one embodiment, the present invention is implemented as a system for preventing bus contention in a multifunction integrated circuit as the circuit undergoes testing. The system is implemented in an integrated circuit adapted to accept a series of test inputs operable for testing the functionality of the integrated circuit. The integrated circuit includes at least one bus (e.g., a PCI bus) for communicatively coupling the multiple functional blocks. At least a first functional block and a second functional block are included in the integrated circuit. The first functional block and the second functional block are both coupled to the bus and coupled to accept the test inputs (e.g. via an included test access port).

A bus arbiter is also included in the integrated circuit for granting ownership of the bus. The bus arbiter is operable to disable at least one output of the second functional block if a corresponding output of the first functional block is activated by using a bus grant signal generated for the first functional block. This guarantees that the test inputs can propagate through the first functional block and the second functional block without causing contention for the bus between the first functional block and the second functional block.

In an alternate embodiment, a centralized test device controller is used to disable the output of the second functional block, as opposed to using the grant signals of the bus arbiter. This allows the incorporation of the implementing logic without altering the logic of the bus arbiter. The centralized "test only" device controller utilizes a dedicated signal for each functional block to enable and disable their respective output drivers.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, a method and system for controlling internal busses to prevent bus contention during internal scan testing by using a centralized control resource, examples of which are illustrated in the accompanying drawings. While the invention will be described in conjunction with the preferred embodiments; it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not unnecessarily to obscure aspects of the present invention.

The present invention is a method and system for eliminating any potential bus contention among multiple functional blocks of an integrated circuit device. The present invention provides a solution that actively controls multiple bus drivers for the multiple functional blocks to eliminate bus contention among the functional blocks as they are stimulated by a series of test inputs (e.g., ATPG test patterns, vectors, etc.). The method and system of the present invention guarantees by design that bus contention cannot occur given any scan test pattern that an ATPG tool might generate, thus allowing the ATPG tool to produce test patterns that will result in much higher fault coverage. Additionally, since the ATPG tool would not have to ensure bus contention could not occur, test patterns can be generated with much faster compile times. The system of the present invention is easily implemented, uniform in construction, and has minimal gate area and system performance impacts on the overall design of integrated circuit device. The present invention and its benefits are further described below.

Figure 1:
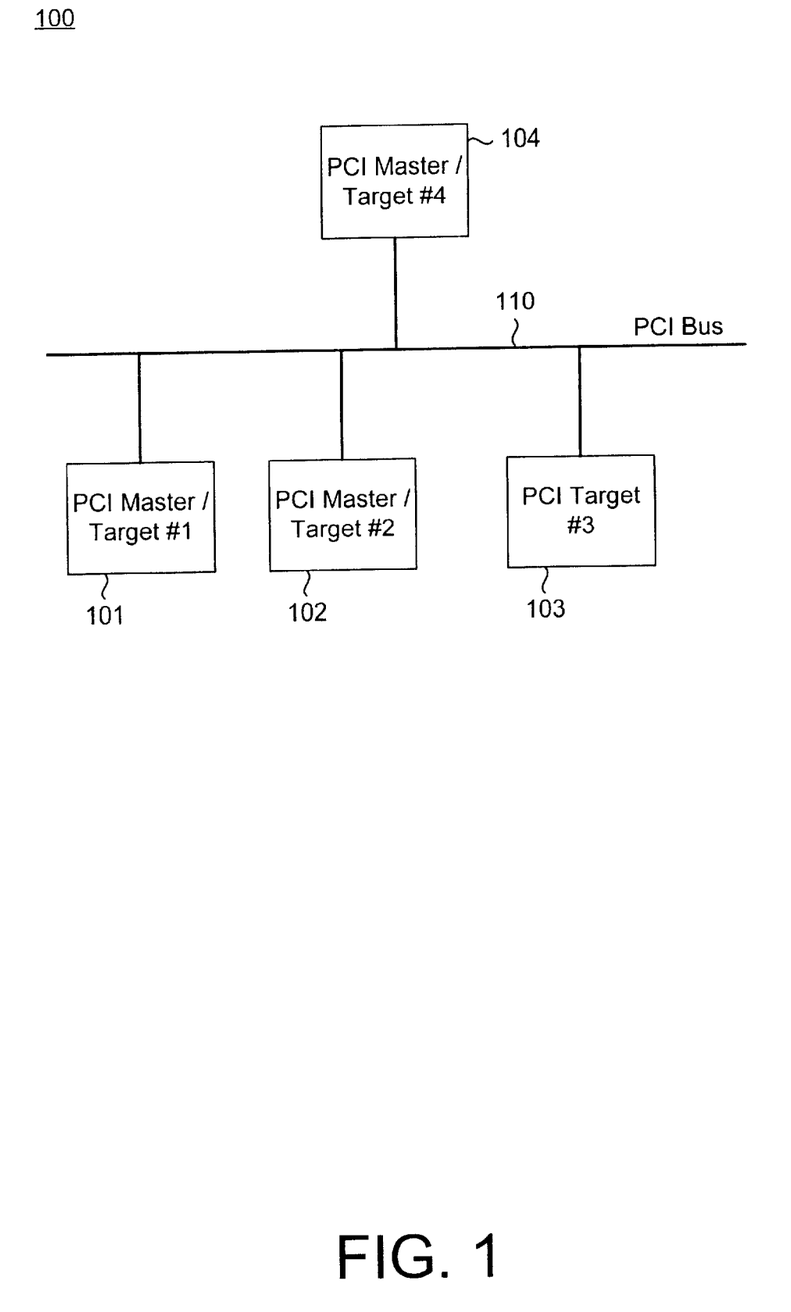
FIG. 1 shows a general diagram of a PCI (peripheral component interconnect) based embodiment of the present invention.

Referring now to FIG. 1, a diagram of a multifunction integrated circuit 100 in accordance with one embodiment of the present invention is shown. FIG. 1 shows a general diagram of a PCI (peripheral component interconnect) based embodiment of the present invention. However, it should be appreciated that the method and system of the present invention can be implemented with other types of shared busses and/or other types of bus standards (e.g., AMBA bus, ASB, AHB, APB, etc.)

As depicted in FIG. 1, integrated circuit 100 includes four functional blocks 101–104, each coupled to a shared bus 110. In this embodiment, the functional blocks 101–104 are PCI agents (e.g., PCI master/target #1, PCI master/target #2, PCI target #3, and PCI master/target #4, respectively) and the shared bus 110 is a PCI bus. Functional blocks 101–103 are PCI master/target agents (e.g., functioning as both PCI initiators and PCI slaves). Functional block 104 is a PCI target-only agent. The blocks 101–104 and bus 110 are integrated within integrated circuit 100 and collectively provide the functionality and utility of the integrated circuit 100.

As described above, the present invention is implemented as a system for preventing bus contention for bus 110 among functional blocks 101–104. During normal operation, the PCI protocols under which integrated circuit 100 operates prevent bus contention among the blocks 101–104. The integrated circuit 100 includes the necessary control logic and support circuitry to operate blocks 101–104 and bus 110 as a fully PCI compliant system (e.g., bus arbitration, device configuration, interfacing and control, etc.). Hence during normal operation there is little danger of bus contention. However, during testing, as is well known, there is a significant danger of bus contention being induced by the various test vectors, test patterns, scan patterns, etc. scanned into integrated circuit 100 to test its functionality. The present invention functions in part by guaranteeing that regardless of any test patterns, vectors, etc. integrated circuit 100 is subjected to, there will be no possibility of bus contention among blocks 101–104.

Referring still to FIG. 1, the present invention provides a solution that actively controls the respective bus drivers for the functional blocks 101–104. This active control guarantees the elimination of any possibility of bus contention among the functional blocks 101–104 as they are stimulated by a series of test inputs (e.g., ATPG test patterns, vectors, etc.). The active control is implemented using control logic incorporated into the design of system 100. This control logic is configured to ensure bus contention cannot occur given any scan test pattern that an ATPG tool might generate. Hence, during test pattern generation for integrated circuit 100, the ATPG tool does not have to deterministically analyze each and every potential test vector to verify contention will not occur. In so doing, the ATPG processing proceeds much more efficiently (e.g., an order of magnitude more efficiently in typical applications). The added efficiency allows the ATPG tool to process integrated circuit 100 more thoroughly, which, for example, allows the ATPG tool to produce test patterns that will result in much higher fault coverage. Additionally, since the ATPG tool would not have to guarantee bus contention would not occur, the added efficiency enables test patterns to be generated with much faster compile times. Yet another advantage of the present invention is the fact that the implementing control logic can be easily added to pre-existing multifunction integrated circuit designs. The implementing logic is uniform in construction and has minimal gate area and system performance impacts on the overall design of a multifunction integrated circuit device (e.g., integrated circuit 100).

Figure 2:
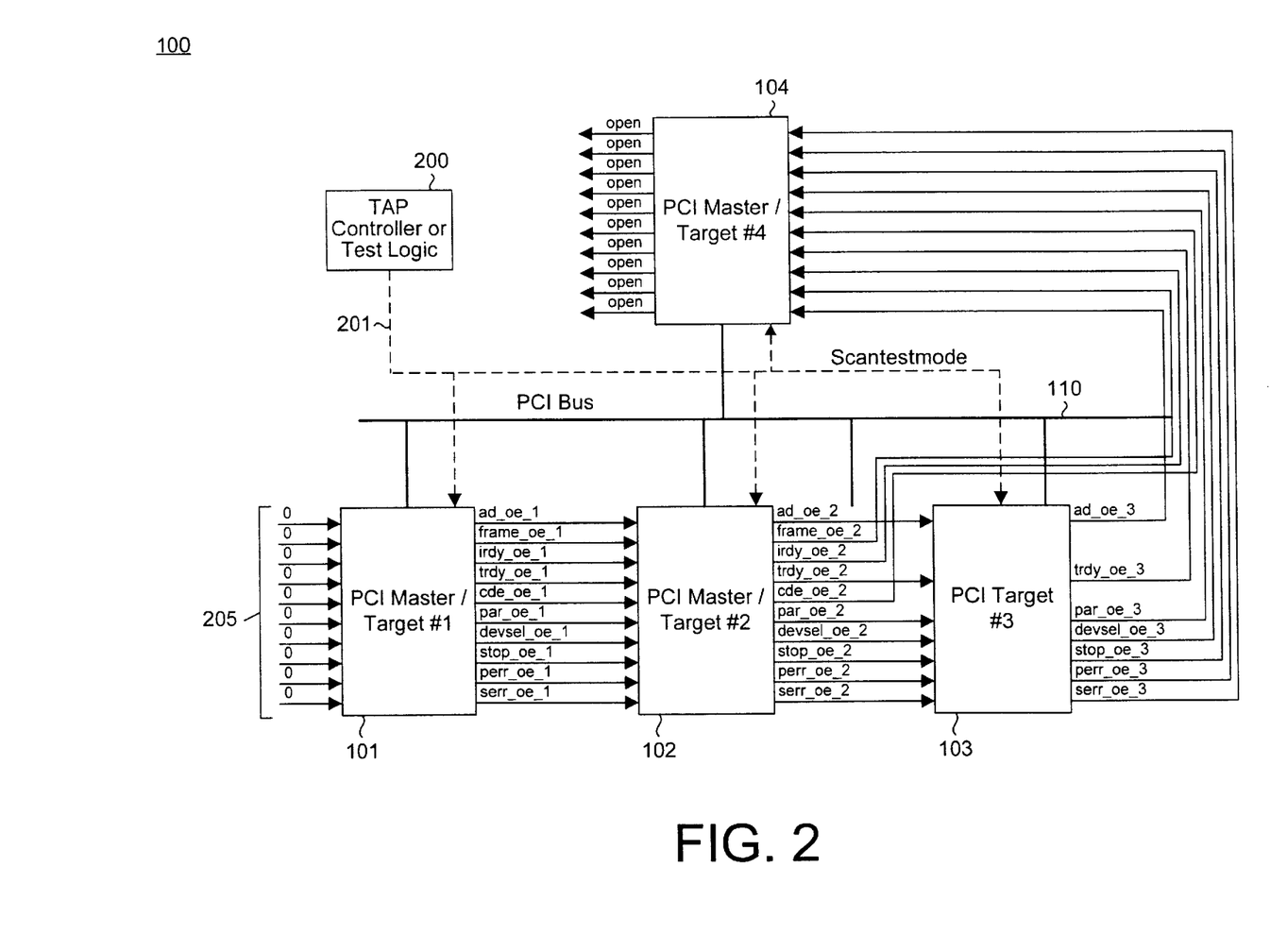
FIG. 2 shows an implementation of integrated circuit from FIG. 1 in accordance with one embodiment of the present invention in greater detail.

FIG. 2 shows an implementation of integrated circuit 100 in accordance with one embodiment of the present invention in greater detail. As depicted in FIG. 2, the functional blocks 101–104 and their respective interconnections of the present embodiment are shown. Each of blocks 101–104 is capable of driving bus 110 during normal operation and must be controlled during scan testing to avoid bus contention. Each of blocks 101–104 are configured to output and receive a series of output enable signals, as shown by arrow 205 (hereafter referred to collectively as output enable signals 205). The output enable signals 205 correspond to specific signals or groups of signals specific to bus 110 and function by enabling or disabling the respective output drivers of blocks 101–104 for the respective signals or groups of signals as shown by table 1 below. As depicted in FIG. 2, the output enable signals 205 cascade from block 101 through block 104, with the exception of block 103 (PCI target #3) where some of output enable signals 205 by-pass block 103 and proceed to block 104. This is because block 103 is a PCI target-only agent and therefore does not need to drive the PCI signals FRAME#, IRDY#, and CBE#. The relationship between the output enable signals 205 and their corresponding PCI signals is shown in table 1 below.

TABLE 1

| | |
|---|---|
| ad_oe_n | AD[31:0] |
| frame_oe_n | FRAME# |
| trdy_oe_n | TRDY# |
| cbe_oe_n | C/BE#[3:0] |
| par_oe_n | PAR |
| devsel_oe_n | DEVSEL# |
| stop_oe_n | STOP# |
| perr_oe_n | PERR# |
| serr_oe_n | SERR# |

Referring still to FIG. 2, in accordance with the present invention, the output enable signals are cascaded from one functional block to the next in an "OR chain" to generate a prioritized hierarchy among the blocks 101–104. This prioritized hierarchy prevents output drivers from different blocks being simultaneously active at any given time. In this embodiment, the output enable signals of each block are cascaded together to form a prioritized chain of logic, as shown in FIG. 2, from block 101 to block 104. The assertion of the output enable of a block will necessarily prevent any other blocks with a lower priority from being asserted. Similarly, if a block with a specific priority is actively driving the signal or bus and a driver with a higher priority is activated, the lower priority driver will immediately de-activate.

FIG. 2 also shows a TAP (test access port) controller 200 coupled to each of blocks 101–104 via a scan test mode signal line. In this embodiment, TAP controller 200 generates the scan test mode signal 201 to inform each functional block 101–104 when scan testing is in progress. As described above, each functional block 101–104 has one output enable signal input for each major grouping of signals on the PCI bus (AD, PAR, CBE, FRAME#, IRDY#, TRDY#, DEVSEL, STOP#, PERR#, and SERR#). These output enable signal inputs (e.g., output enable signals 205) inform the respective block whether any higher priority block is driving the PCI bus. Each functional block also has a corresponding output enable signal output for each major grouping of signals on the PCI bus. As shown in FIG. 2, these output enable signal outputs are cascaded to the output enable signal inputs of the next priority functional block.

For example, referring still to FIG. 2, functional block 101 has the highest priority and functional block 104 has the lowest priority. If functional block 101 (e.g., PCI master/target #1) was driving the AD[31:0], FRAME#, and STOP# signal lines of bus 110 during scan test mode (e.g., the ATPG tool created a scan pattern which forced it to do so), then functional block 101 asserts its ad_oe_1, frame_oe_1, and stop_oe_1 outputs. Functional block 102 would then see these signals asserted and would not drive them even if the ATPG tool created a scan pattern which told it to do so. Functional block 102 (e.g., PCI master/target #2) would forward this information on to the lower priority blocks by asserting its ad_oe_2, frame_oe_2, and stop_oe_2 signals. It should be noted that block 101 has its output enable signal inputs tied low (logical zero). This makes blocks 101 the highest priority block since it will never be pre-empted. Block 104 has its output enable signal outputs left open. This makes it the lowest priority block since it will never pre-empt another device. In this manner, the asserted ad_oe_1, frame_oe_1, and stop_oe_1 outputs are cascaded along, from the higher priority blocks to the lowest priority block.

It should be noted that block 103 is a target-only PCI agent. Since block 103 has no bus mastering capability, it does not have the FRAME#, IRDY#, and C/BE(3:0) signals from bus 110 in its interface. In this case, the output enable signals frame_oe_2, irdy_oe_2, and cbe_oe_2 bypass block 103 and connect to block 104.

It should also be noted that in the present embodiment, the output enable signal inputs and outputs are all active high signals. For example, if one of blocks 101–104 sees one of its output enable signal inputs high during scan test mode, it will not drive the corresponding portion of the PCI bus and will in turn assert the corresponding output enable signal output.

Figure 3:
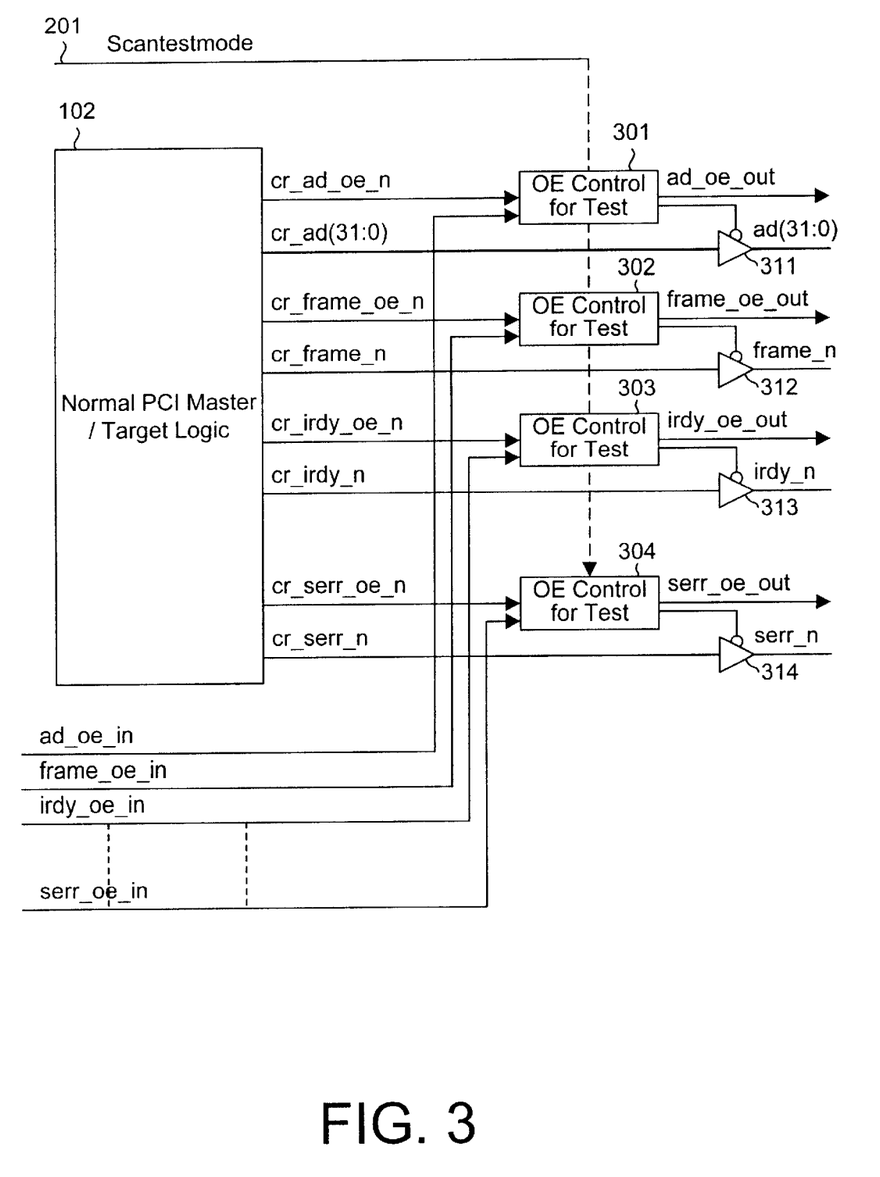
FIG. 3 shows a diagram of the logic necessary to modify a pre-existing functional block in accordance with one embodiment of the present invention.

Referring now to FIG. 3 a diagram of the logic necessary to modify a pre-existing functional block in accordance with one embodiment of the present invention is shown. FIG. 3 shows the interconnection logic used with the present invention (e.g., to guarantee that there will be no bus contention on the Bus 110 during scan testing). In this case, block 102 is shown. Block 102 as depicted in FIG. 3 represents the normal logic that implements a PCI master/target, less the tristate drivers that drive the PCI bus. This implementation of the present invention requires the addition of an "OE Control for Test" block for each output enable signal. Four of these blocks, OE Control for Test 301–304, are shown. The OE Control for Test blocks take the output enable signals from the existing block (e.g., block 102), cr_xx_oe_n (where "xx" corresponds to the signal type, e.g., ad, frame, irdy, etc.), along with the scantestmode signal and the output enable signal from the next higher priority PCI device, xx_oe_in from block 101, and generate the actual output enable for the tristate drivers and the output enable signal outputs to the next lower priority block, xx_oe_out for block 103. It should be noted that FIG. 3 assumes active low output enable logic for the tristate drivers (e.g., tristate drivers 311–314).

Figure 4:
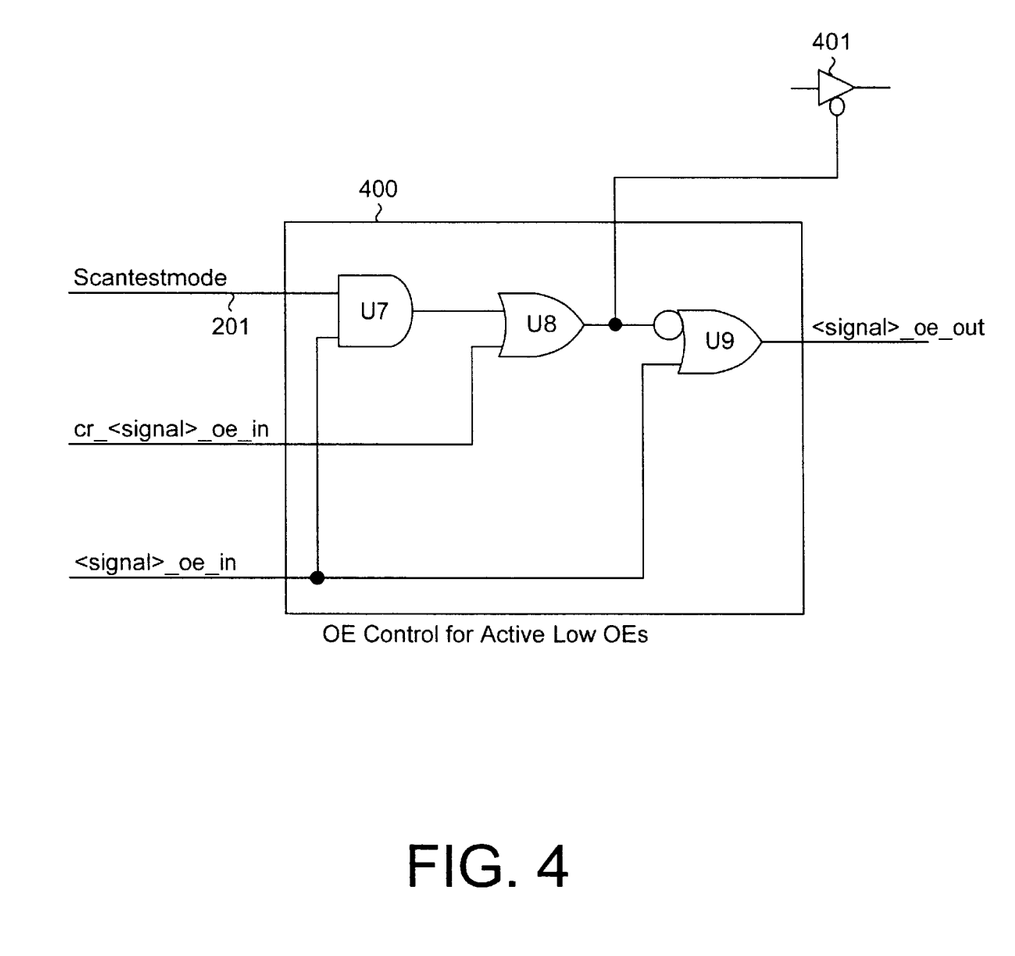
FIG. 4 shows the internal logic of an example OE Control for Test block in accordance with one embodiment of the present invention, wherein the tristate drivers have active low output enable logic.

Referring now to FIG. 4, the internal logic of an example OE Control for Test controller 400 in accordance with one embodiment of the present invention is shown. Controller 400 shows logic in accordance with tristate drivers which have active low output enable logic (e.g., tristate driver 401). In the present embodiment, controller 400 has three inputs and two outputs. If the scantestmode input 201 is low then the "Output Enable for Test" logic is disabled and the block's output enable signal, cr_<signal>_oe_n, is used to control the tristate driver 401. If scantestmode 201 is high then the "Output Enable for Test" logic is enabled and the output enable signal input from the next higher priority block, <signal>_oe_in, is used to control this block's output enable. If <signal>_oe_in is high, then the previous block is driving the bus 110. In this case the controller 400 deasserts the tristate driver 401 and asserts the output enable control signal output to the next lower priority PCI device, <signal>_oe_out. If <signal>_oe_in is low then the block's output enable signal, cr_<signal>_oe_n, is used to control the tristate driver 401. If cr_<signal>_1_oe_n is asserted low then controller 400 asserts the output enable control signal output to the next lower priority block, <signal>_oe_out to tell it not to drive the bus 110.

Figure 5:
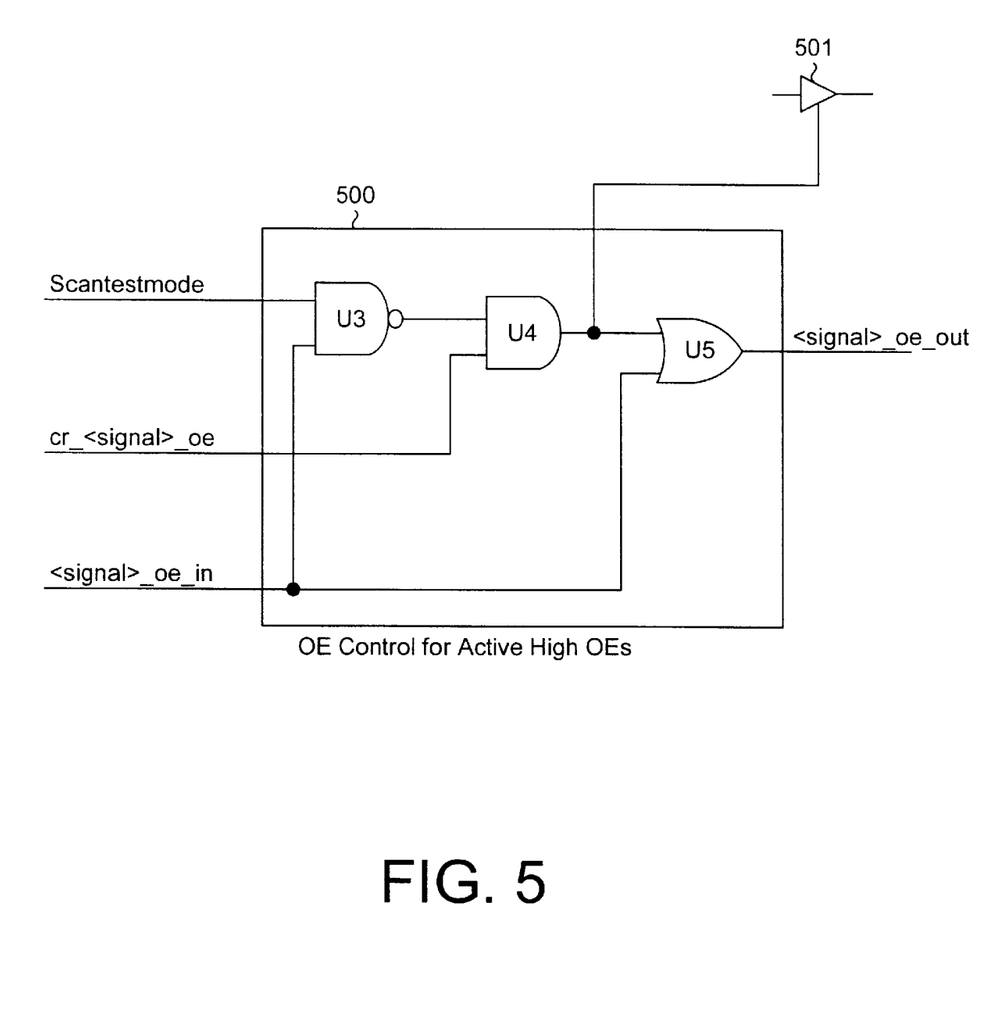
FIG. 5 shows an example OE Control for Test block configured for tristate drivers which have active high output enable logic, in accordance with one embodiment of the present invention.

FIG. 5 shows an example OE Control for Test controller 500 configured for tristate drivers (e.g., driver 501) which have active high output enable logic, in accordance with one embodiment of the present invention. Controller 500 functions in a substantially similar manner as controller 400 from FIG. 4. However, the internal logic for controller 500 is configured for tristate drivers which have active high output enable logic.

In this manner, the embodiments depicted in FIGS. 1–5 guarantees that bus contention will not occur during scan testing. In so doing, the ATPG processing performed by an ATPG tool proceeds much more efficiently, requiring much less time to generate high-quality test patterns/vectors. Additionally, these test patterns/vectors provide much better fault coverage than those generated in accordance with the prior art, where it is left to the ATPG tool to resolve all bus contention issues. The implementing hardware of the present invention is can be readily incorporated by modifying each functional block in a prospective integrated circuit.

A First Alternative Embodiment

Figure 6:
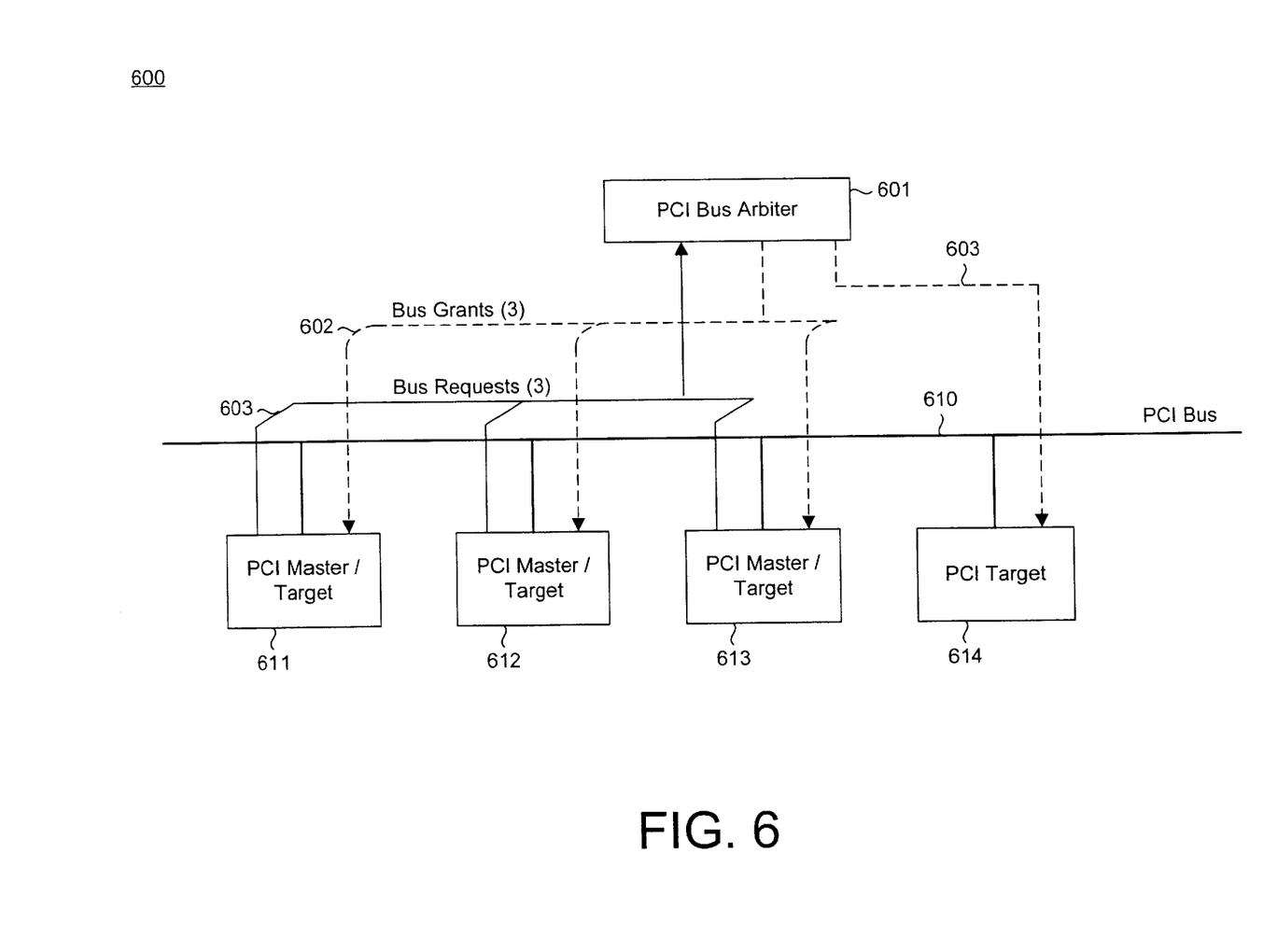
FIG. 6 shows a system in accordance with a first alternative embodiment of the present invention.

Referring now to FIG. 6, a system 600 in accordance with an alternative embodiment of the present invention is shown. Whereas the embodiments of FIGS. 1–5 use a distributed solution to disable functional blocks 101–104 from driving signals on bus 110, the alternative embodiment of system 600 utilizes a centralized resource to enable one of blocks 611–614 to drive the entirety of bus 610. As with the embodiments of FIGS. 1–5, the embodiment of FIG. 6 is described with respect to a PCI bus implementation (e.g., bus 610), however, it should be noted that system 600 may be extended to other types of bus structures.

As depicted in FIG. 6, functional blocks 611–613 are PCI master/target agents and functional block 614 is a PCI target-only agent. A PCI target-only agent contains register or memory resources that are accessible by the PCI bus 610. A PCI master-only agent contains the ability to arbitrate for bus ownership and access register or memory resources on bus 610, but typically has no register or memory resources of its own. A PCI Master/Target device contains both target resources and the master's ability to access other resources.

System 600 is a general PCI bus system containing a single PCI Bus Arbiter 601, blocks 611–613 which have both a PCI master and target interface, and a single block 614 which is a PCI target-only agent. The blocks with master interfaces drive bus request signals to the arbiter 601 (e.g., bus requests 603 ). The arbiter 601 drives bus grant signals 602 to each PCI master agent (e.g., blocks 611–613 ). Block 614, being a target-only PCI agent, does not use a request or grant signal.

The alternative embodiment of FIG. 6 prevents bus contention during scan testing by using the PCI bus arbiter 601 to grant the bus 610 to one of the blocks 611–614. In accordance with the present embodiment, blocks 611–614 are modified to accept this grant during scan testing such that a block sampling grant asserted means "drive the bus" and sampling grant deasserted means "disable all bus drivers". Since the flip flops in the PCI Bus Arbiter 601 which are used to generate the bus grants are on the scan chain, the ATPG tool can force scan data such that the appropriate one of blocks 611–614 drives the bus 610 as desired.

The embodiment of FIG. 6 includes logic to handle two special situations. The first situation being what logic to implement in a case where an integrated circuit includes PCI target-only type functional blocks which do not utilize bus grant signals. The second situation being how to handle a case where the ATPG tool causes the assertion of multiple grant signals during scan testing. The resolution of these special situations are discussed below.

Referring still to FIG. 6, in accordance with the present embodiment, the PCI bus arbiter 601 acts as the central resource for enabling each functional block's tristate drivers during scan test mode. Any of blocks 611–614 which has its bus grant asserted during scan test shall drive the PCI bus 610 (AD[31:0], CBE, PAR, PERR#, SERR#, FRAME#, IRDY#, TRDY#, DEVSEL#, and STOP#). This includes PCI target-only agents and master-only agents. It should be noted that bus grant 604 is a new signal that must be added to target-only agents (e.g., block 614). It should also be noted that the "special" bus grant 604 for target-only agents (e.g., block 614) is an output from PCI bus arbiter 601 that only functions during scan test mode.

In the event that a target-only block is selected, the PCI bus arbiter 601 drives the PCI master type signals, CBE, FRAME#, and IRDY#. This is due to the fact that a target-only agent (e.g., block 614) has no need under normal operation to drive these signals and therefore will not have them in its interface. Similarly, in the event that a master-only type agent is selected, the PCI bus arbiter 601 drives the PCI target agent unique signals, TRDY#, DEVSEL#, and STOP# as a master-only type agent has no need to drive them under normal operation.

There are internal PCI bus implementations which do not tristate the FRAME#, IRDY#, TRDY#, STOP#, DEVSEL#, REQ#(0:N), PERR#, SERR#, and/or INT(A:D) signals. In such an implementation the PCI bus arbiter 601 has no need to drive them as described in the previous paragraph.

Rather than have the PCI bus arbiter 601 drive the CBE, FRAME#, IRDY#, TRDY#, DEVSEL#, and STOP# signals if target type or master-only type agents are selected, there are implementations that may choose to not drive these signals but instead let them float. This will result in some fault coverage reduction, but it may not be enough to warrant adding the extra complexity into the arbiter design.

During scan test the PCI bus arbiter 601 is responsible for asserting one and only one grant signal. The flip flops in the arbiter responsible for generating PCI bus grants are on the scan chain such that the ATPG tool can shift data into them to grant the bus 610 to whichever of functional blocks 611–614 it desires. But the ATPG tool also may attempt to assert multiple bus grants. PCI bus arbiter 601 must still guarantee that only one of blocks 611–614 is selected. In the event that no device is selected, the PCI bus arbiter 601 grants the bus 610 to the "default" block. This default block may be chosen to be any of blocks 611–614, or any such block on bus 610.

Figure 7:
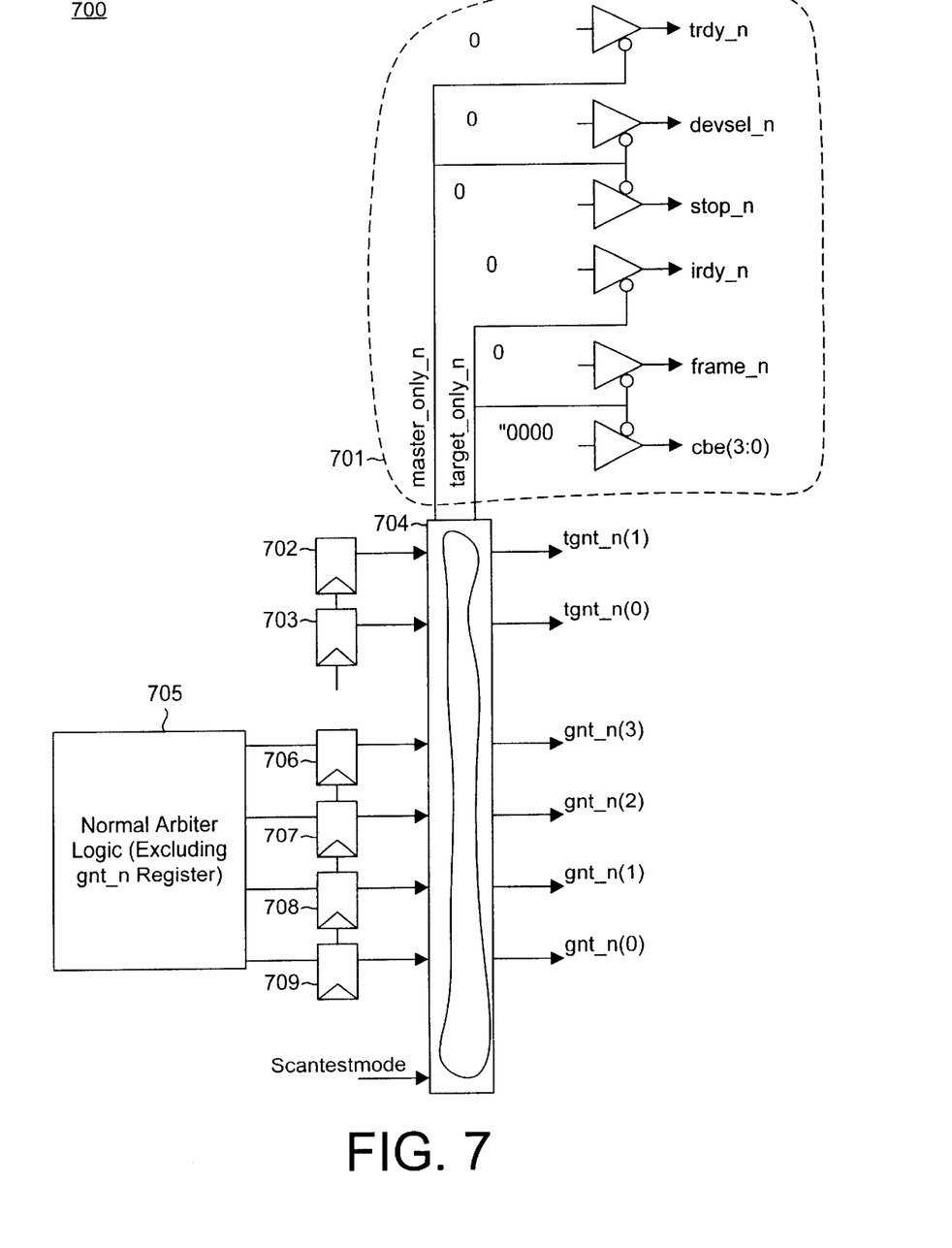
FIG. 7 shows a diagram of a PCI bus arbiter in accordance with the first alternative embodiment of the present invention.

Referring now to FIG. 7, a diagram of a PCI bus arbiter 700 in accordance with the alternative embodiment of the present invention is shown. The depiction of PCI bus arbiter 700 shows the logic required to implement the grant signals (e.g., grant signals 603–604 of FIG. 6) and generate the signals CBE[3:0], FRAME#, IRDY#, TRDY#, DEVSEL#, and STOP#. PCI bus arbiter 700 is an example arbiter with four PCI master/target type agents and two PCI target-only type agents. The target grant signals are shown as tgnt(1:0). In the present embodiment, the additions to the logic of a conventional PCI bus arbiter 705 are the flip flops 702–703 to drive the target grant signals, the combinational logic 701 to generate CBE[3:0], FRAME#, IRDY#, TRDY#, DEVSEL#, and STOP#, and the combinational logic 704 to guarantee that only one grant is asserted during scan test. During normal operation (scantestmode=0) the PCI bus grants, gnt_n(3:0) are driven straight from the flip flops 706–709, the "target grants" are deasserted, and CBE(3:0), FRAME#, IRDY#, TRDY#, DEVSEL#, and STOP# are tristated. During scan test (scantestmode=1) the gnt_n and tgnt_n outputs are driven from the flip flops 706–709 and 702–703 respectively (i.e., by the ATPG tool) unless multiple grants are asserted. If multiple grants are asserted by the flip flops then the combinational logic 704 must choose one of the grants to assert while deasserting all others. If no grants are asserted by the flip flops, then the combinational logic 704 must choose one of the grants to assert while deasserting all others. If the grant signal asserted is one of the "target grant" signals, then CBE(3:0), FRAME#, are IRDY# are driven to a constant value (shown as zeros in the example). If the grant signal asserted is for a PCI master-only type agent then TRDY#, DEVSEL#, and STOP# are driven.

Figure 8:
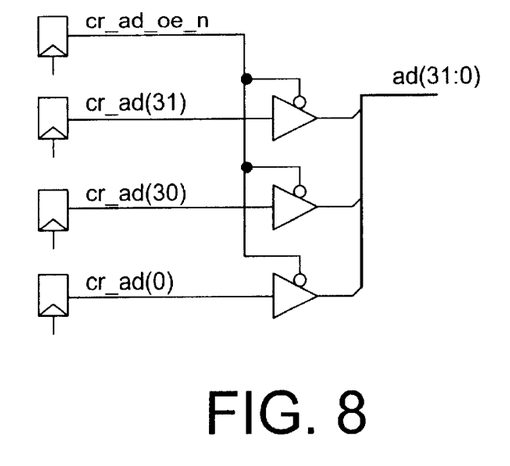
FIG. 8 shows the typical logic used by a functional block to generate the output enable for the address/data portion of a PCI bus in accordance with the first alternative embodiment of the present invention.

FIG. 8 shows the typical logic used by a functional block to generate the output enable for the address/data portion of PCI bus 610 in accordance with the present embodiment (e.g., ad(31:0)). It only shows one output enable being generated for the entire bus 610. It is common to have multiple flops generating output enables for different portions of the bus, but this is a readily incorporated extension to this implementation.

Figure 9:
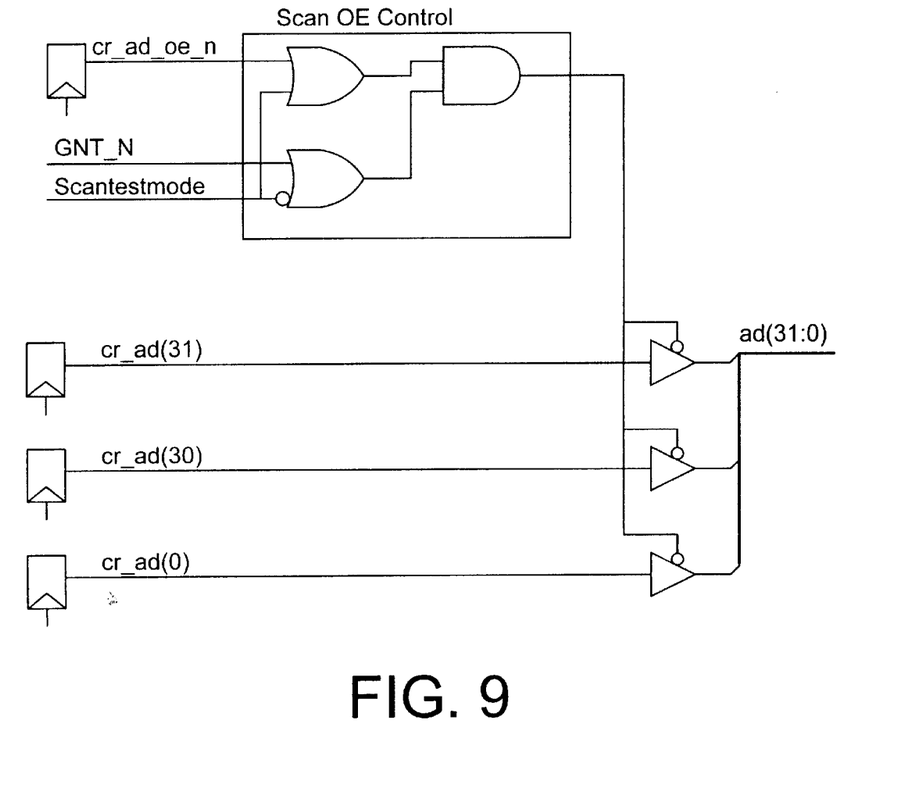
FIG. 9 shows the logic in accordance with the first alternative embodiment needed by a functional block to guarantee that there is never any bus contention during scan test mode.

FIG. 9 shows the logic in accordance with the present embodiment needed by a functional block to guarantee that there is never any bus contention during scan test mode. During normal operation (scantestmode=0) the functional block's normal output enable signal, cr_ad_oe_n, is used to enable its output drivers. But, in accordance with present embodiment, during scan test (scantestmode=1) the grant signal, gnt_n, shall be used to enable the output drivers. The depiction of FIG. 9 assumes that the output enables are active low.

Figure 10:
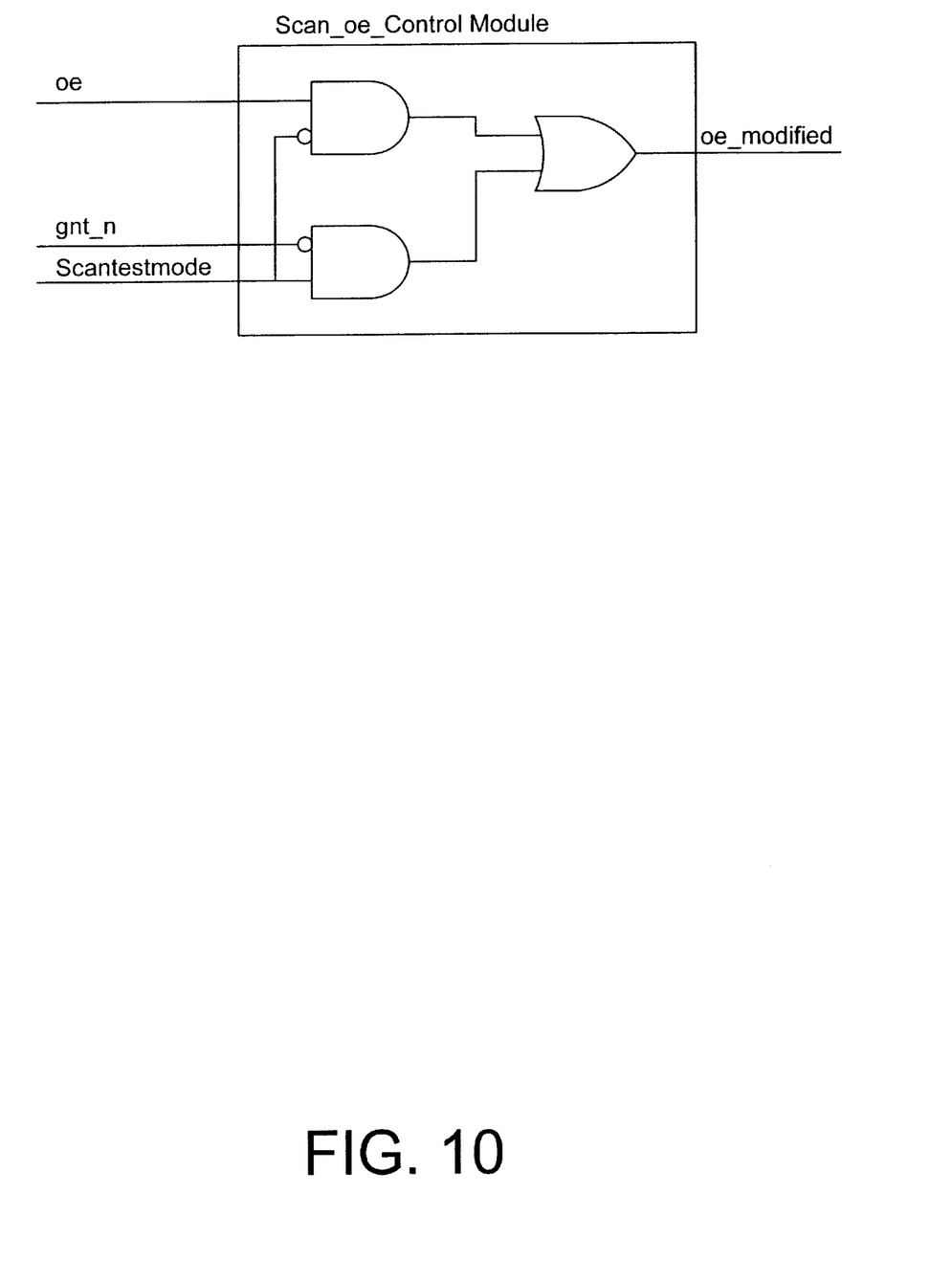
FIG. 10 shows the logic in accordance with the first alternative embodiment where the output enables are active high as opposed to active low.

FIG. 10 shows the logic in accordance with present embodiment where the output enables are active high as opposed to active low. Thus, the alternative embodiment of FIGS. 6–10 guarantees that bus contention will not occur during scan testing. This greatly eases the job of the ATPG tool and will provide much better fault coverage with quicker compile times in comparison to prior art where it is left for the ATPG tool to resolve all bus contention issues. As with the embodiment of FIGS. 1–5, this alternative embodiment can be readily implemented by modifying each functional block in the system and the central PCI bus arbiter.

A Second Alternative Embodiment

A second alternative embodiment in accordance with present invention can also be implemented. This second alternative embodiment is substantially similar to the first alternative embodiment of FIGS. 6–10 except for the fact that the centralized resource for controlling each functional block during scan test mode is not the PCI-Bus Arbiter, but rather a stand alone "test only" block. With this embodiment is not necessary to alter the PCI bus arbiter's design. The required logic is incorporated into the "test only" block. This "test only" block then generates "select" signals rather than grant signals. These select signals would be used by each functional block to drive the bus during scan testing. rather than the grant signals as presented in the first alternative embodiment of FIGS. 6–10. The logic inside of each PCI device would be substantially similar to that of the first alternative embodiment of FIGS. 6–10.

Figure 11:
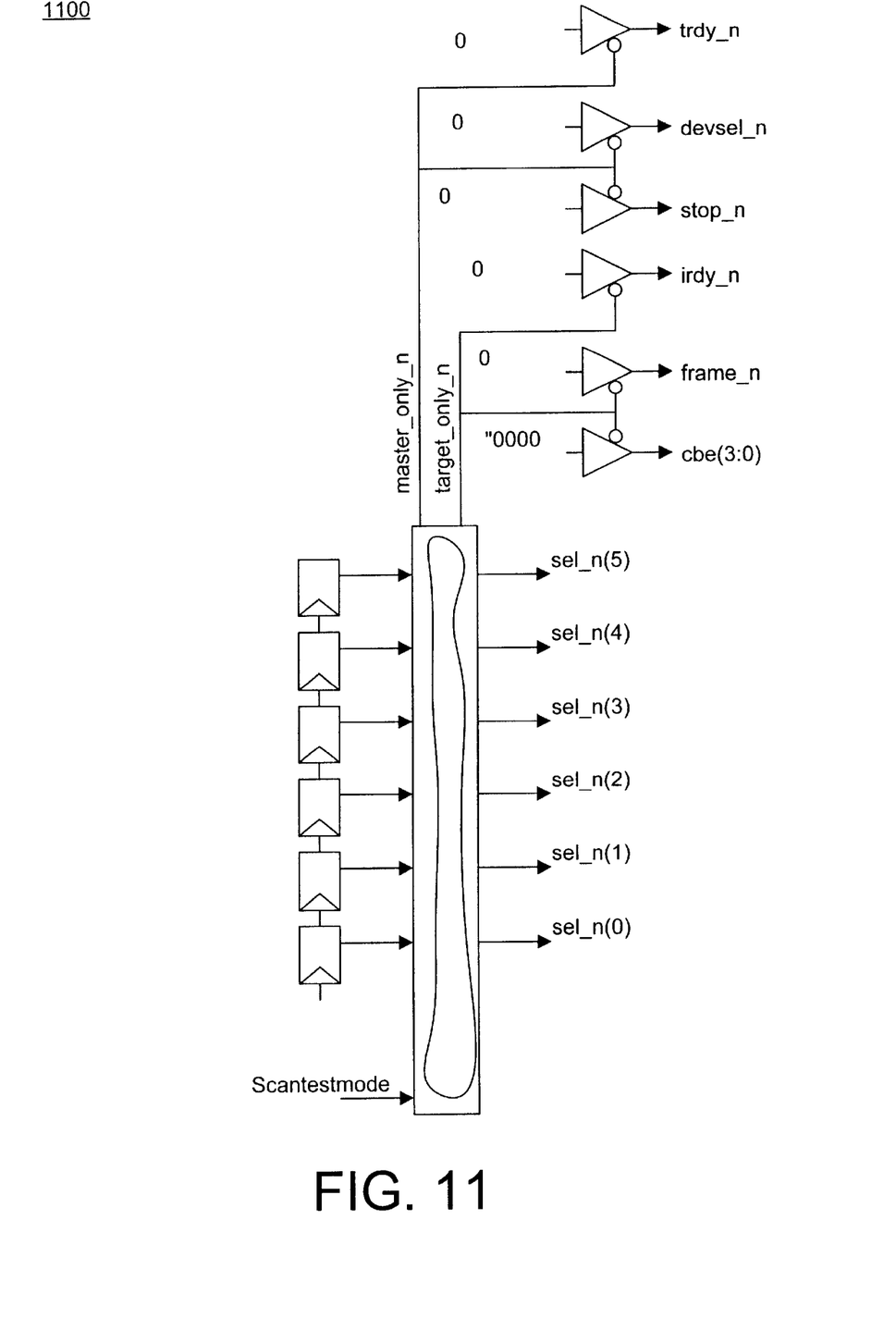
FIG. 11 shows a diagram of a Test Only block in accordance with a second alternative embodiment of present invention.

FIG. 11 shows a diagram of a Test Only block 1100 in accordance with the second alternative embodiment of present invention. The test only block 1100 is substantially the same circuitry that is added to the PCI Bus Arbiter 705 of FIG. 7. It should be noted that with this second alternative embodiment there is no distinction between target type select signals and master type signals like there was with target type grants and master type grants of the first alternative embodiment.

Figure 12:
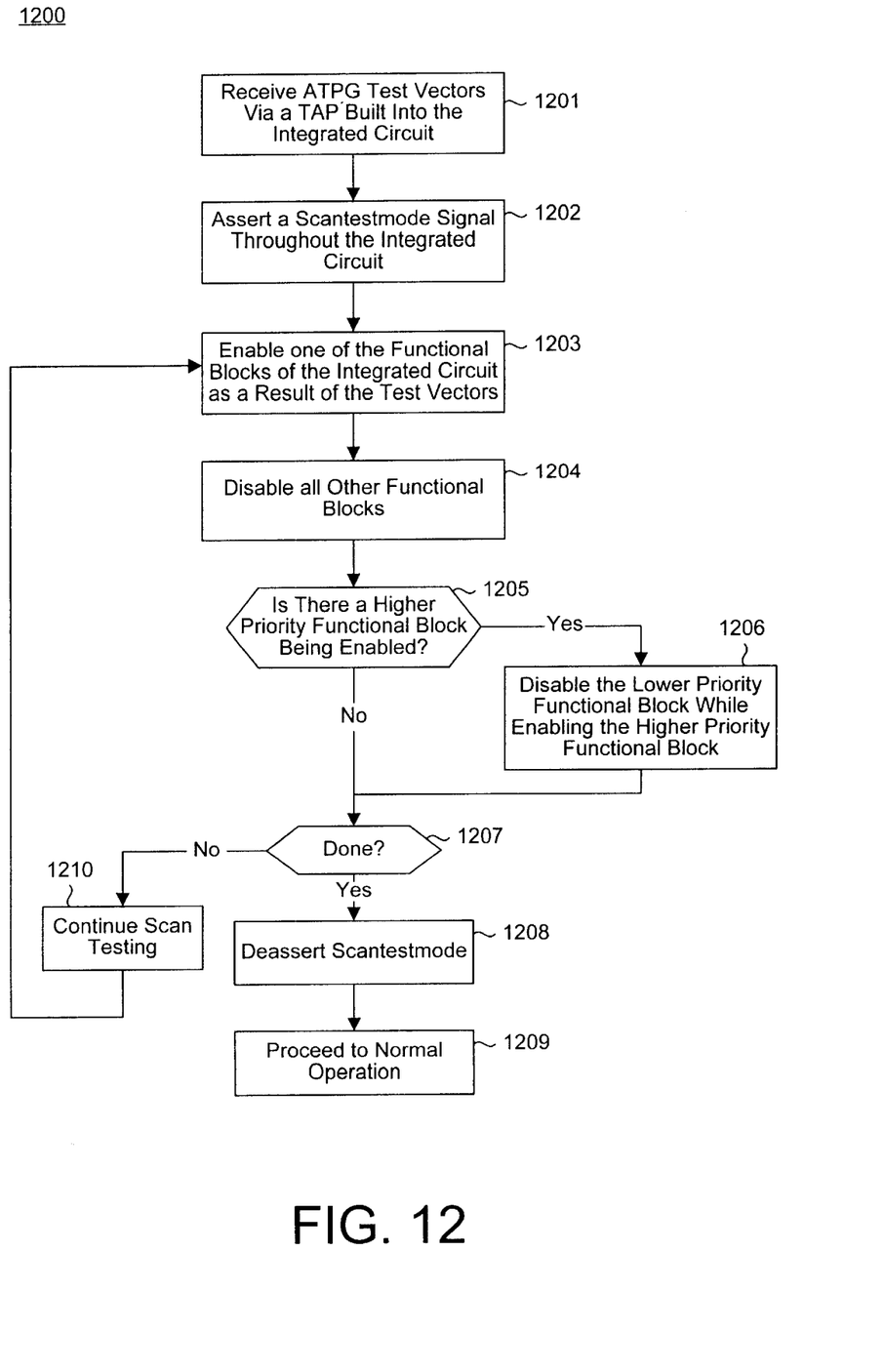
FIG. 12 shows a flow chart of the steps of an operating process in accordance with one embodiment of the present invention.

Referring now to FIG. 12, a flowchart of the steps of a process 1200 in accordance with one embodiment of the present invention is shown. Process 1200 shows the general operating steps of a multifunction integrated circuit in accordance with the present invention. Process 1200 depicts the general operating steps, hence, process 1200 is equally applicable for depicting the operation of the different embodiments described above (e.g., the embodiment of FIGS. 1–5, and the first and second alternative embodiments). However, process 1200 will be described below with respect to the embodiment of FIGS. 1–5.

Process 1200 begins in step 1201, where a multifunction integrated circuit in accordance with one embodiment of the present invention (e.g., integrated circuit 100 of FIG. 1) receives ATPG test vectors (e.g., via scan chains, pins, etc.). As described above, test vectors/test patterns are shifted into integrated circuit 100 by an ATE machine and the TAP (e.g., TAP 200 of FIG. 2) is used to place the integrated circuit into a testing mode.

In step 1202, in response to the test vectors received in step 1201, a scan test mode signal "scantestmodea" is asserted to each functional block of the integrated circuit. This signal functions by configuring the functional blocks for testing, converting them from a normal operating mode to a test mode. In each of the embodiments described above, the "scantestmode" signal activates the logic of the present invention.

In step 1203, as a result of the test vectors from step 1201 being applied to the functional blocks of the integrated circuit, one of the functional blocks is enabled in order to test its operating characteristics.

In step 1204, all other functional blocks are disabled by the logic of the present invention. As described above, in the embodiment of FIGS. 1–5, this logic is apportioned among each of the functional blocks. and second alternative embodiments, the implementing logic is centralized in the arbiter (e.g., PCI bus arbiter 601 of FIG. 6) or a stand-alone test only device (e.g., test only device 1100 of FIG. 11). In so doing, regardless of the effect of any test vector/test pattern applied, only one functional block can drive signals of the bus.

In step 1205, the implementing logic of the present invention continually monitors whether there is a higher priority functional block, other than the functional block currently driving the bus, that is being enabled as a result of new test vectors being shifted in.

In step 1206, in the case of a higher priority functional block being enabled, the lower priority functional block currently driving the bus is immediately disabled while the higher priority functional block has its output drivers enabled. As described above, the implementing logic ensures no two sets of output drivers from different functional blocks can simultaneously drive respective signal lines of the bus.

In steps 1207 and 1210, the testing process of the present invention continues, with new test vectors continually being shifted in and resulting test data continually being shifted out as the functionality of the integrated circuit is fully verified.

In step 1208, where the testing process is complete, the scantestmode signal is deasserted throughout the integrated circuit. This reconfigures the functional blocks and the logic of the present invention out of testing mode and into normal operating mode.

Subsequently, in step 1209, the integrated circuit proceeds to normal operation. As described above, during normal operation, the output drivers of the functional blocks are controlled by their respective normal operating mode logic (e.g., in accordance with PCI specifications). The implementing logic of the present invention "sleeps" until the assertion of another scantestmode signal, signifying the commencement of another testing process.

Thus, the present invention provides a method and system for eliminating any potential bus contention among multiple functional blocks of an integrated circuit device. The present invention provides a solution that actively controls multiple bus drivers for the multiple functional blocks to eliminate bus contention among the functional blocks as they are stimulated by a series of test inputs (e.g., ATPG test patterns, vectors, etc.). The method and system of the present invention guarantees by design that bus contention cannot occur given any scan test pattern that an ATPG tool might generate, thus allowing the ATPG tool to produce test patterns that will result in much higher fault coverage. Additionally, since the ATPG tool would not have to ensure bus contention could not occur, test patterns can be generated with much faster compile times. The system of the present invention is easily implemented, uniform in construction, and has minimal gate area and system performance impacts on the overall design of integrated circuit device.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed is:

1. A system for preventing bus contention in a multifunction integrated circuit under testing, comprising:
   an integrated circuit adapted to accept a series of test inputs operable for testing the functionality of the integrated circuit;
   a bus included in the integrated circuit;
   at least a first functional block and a second functional block included in the integrated circuit, the first functional block and the second functional block coupled to the bus and coupled to accept the test inputs; and
   a bus arbitration unit included in the integrated circuit, the bus arbitration unit operable for arbitrating for ownership of the bus;
   the bus arbitration unit further operable to disable the outputs of the second functional block if corresponding outputs of the first functional block are activated such that the test inputs can propagate through the first functional block and the second functional block while contention for the bus between the first functional block and the second functional block is prevented.

2. The system of claim 1 wherein the bus included in the multifunction integrated circuit is a PCI (peripheral component interconnect) bus and the first functional block and the second functional block are PCI functional blocks.

3. The system of claim 1, wherein the bus arbitration unit disables the at least one output by disabling an output driver of the second functional block for the at least one output.

4. The system of claim 3, wherein a bus grant signal from the bus arbitration unit asserted to the first functional block causes the first functional block to drive the bus and the deassertion of a grant signal for the second functional block disables the output drivers for the second functional block, thereby preventing contention for the bus.

5. The system of claim 1, wherein the bus arbitration unit includes logic for ensuring only one bus grant signal for either the first functional block or the second functional block can be active at one time, regardless of the test inputs received.

6. The system of claim 1, wherein the multifunction integrated circuit further includes a TAP (test access port) controller operable for placing the multifunction integrated circuit into a testing mode.

7. A system for preventing bus contention in a PCI (peripheral component interconnect) based multifunction integrated circuit under testing, comprising:

an integrated circuit adapted to accept a series of test inputs operable for testing the functionality of the integrated circuit;

a PCI bus included in the integrated circuit;

a series of functional blocks included in the integrated circuit, the functional blocks coupled to the PCI bus and coupled to accept the test inputs; and a test device controller included in the integrated circuit, the test device controller respectively coupled to the functional blocks and operable to disable at least one output of each of the respective functional blocks if a corresponding output of a higher priority one of the functional blocks is activated such that the test inputs can propagate through the functional blocks while contention for the PCI bus among the functional blocks is prevented.

8. The system of claim 7, wherein the higher priority functional blocks preempt the lower priority functional blocks to drive the PCI bus, as implemented by the test device controller.

9. The system of claim 7, wherein the test device controller disable the at least one output by disabling an output driver of the respective functional blocks for the at least one output.

10. The system of claim 7, wherein a select signal from the test device controller asserted to the first functional block causes the first functional block to drive the bus and the deassertion of a select signal for the second functional block disables the output drivers for the second functional block, thereby preventing contention for the bus.

11. The system of claim 7, wherein the test device controller includes logic for ensuring only one select signal for either the first functional block or the second functional block can be active at one time, regardless of the test inputs received.

12. The system of claim 7, wherein the multifunction integrated circuit further includes a TAP (test access port) controller operable for generating a scan test mode signal that configures the test device controller for a testing mode.

13. In a multifunction integrated circuit, a method for preventing bus contention in the integrated circuit while under testing, the method comprising:

accept a series of test inputs operable for testing the functionality of the integrated circuit in the integrated circuit;

accept the test inputs in at least a first functional block and a second functional block included in the integrated circuit, the first functional block and the second functional block coupled to the bus; and disabling at least one output of the second functional block if a corresponding output of the first functional block is activated such that the test inputs can propagate through the first functional block and the second functional block while contention for the bus between the first functional block and the second functional block is prevented, the disabling performed by a bus arbiter included in the integrated circuit, the bus arbiter coupled to the second functional block and the first functional block.

14. The method of claim 13 wherein the bus included in the multifunction integrated circuit is a PCI (peripheral component interconnect) bus and the first functional block and the second functional block are PCI functional blocks.

15. The method of claim 13, further including the step of disabling the at least one output by asserting a bus grant signal to the first functional block that causes the first functional block to drive the bus and deasserting a grant signal to the second functional block that disables the output drivers for the second functional block, thereby preventing contention for the bus.

16. The method of claim 13, wherein the multifunction integrated circuit further includes a TAP (test access port) controller operable for generating a scan test mode signal that configures the test device controller for a testing mode.

* * * * *